United States Patent [19]

Moshrefzadeh et al.

[11] Patent Number: 6,077,560
[45] Date of Patent: *Jun. 20, 2000

[54] METHOD FOR CONTINUOUS AND MASKLESS PATTERNING OF STRUCTURED SUBSTRATES

[75] Inventors: Robert S. Moshrefzadeh, Oakdale; Richard J. Pokorny, Maplewood; Raghunath Padiyath, Woodbury; Wayne M. Wirth, North St. Paul, all of Minn.

[73] Assignee: 3M Innovative Properties Company, St. Paul, Minn.

[*] Notice: This patent issued on a continued prosecution application filed under 37 CFR 1.53(d), and is subject to the twenty year patent term provisions of 35 U.S.C. 154(a)(2).

[21] Appl. No.: 08/999,287
[22] Filed: Dec. 29, 1997
[51] Int. Cl.[7] .......................................... B05D 5/12
[52] U.S. Cl. ................. 427/108; 427/123; 427/126.3; 427/164; 427/264; 427/265; 427/271; 427/331; 427/404; 427/443.2
[58] Field of Search .................. 427/271, 264, 427/265, 402, 108, 123, 126.3, 164, 331, 443.2, 404

[56] References Cited

U.S. PATENT DOCUMENTS

| | | |
|---|---|---|
| 1,983,720 | 12/1934 | West ........................................ 427/271 X |
| 3,244,556 | 4/1966 | Mytych . |
| 3,287,161 | 11/1966 | Schwertz et al. . |
| 5,268,782 | 12/1993 | Wenz et al. ................................. 359/81 |
| 5,378,494 | 1/1995 | Thomas et al. ............................. 427/58 |
| 5,382,317 | 1/1995 | Thomas ..................................... 156/654 |
| 5,538,753 | 7/1996 | Antes et al. ................................. 427/7 |

FOREIGN PATENT DOCUMENTS 0 564 364 A2   10/1993   European Pat. Off. .

*Primary Examiner*—Bernard Pianalto
*Attorney, Agent, or Firm*—Robert J. Pechman

[57] ABSTRACT

A method of selectively patterning a structured substrate without using a mask is disclosed. The method includes the steps of providing a surface having a plurality of protrusions, coating the surface with a filler material thick enough so that the protrusions are covered, and planarizing the filler coating. The filler material is thereafter partially removed in a uniform fashion to expose only those portions of the protrusions to be modified. After modifying the protrusions by, for example, deposition or etching, the remaining filler material may be removed, resulting in a structured substrate selectively modified or patterned at its protrusions.

14 Claims, 3 Drawing Sheets

METHOD FOR CONTINUOUS AND MASKLESS PATTERNING OF STRUCTURED SUBSTRATES

FIELD OF THE INVENTION

The present invention relates generally to a process for continuous patterning of structured substrates without using a mask as is required in conventional lithography processes.

BACKGROUND OF THE INVENTION

The use of structured substrates has become increasingly important in a variety of applications. Their use has become especially important in applications where very small structures are desired and where dimensional tolerances are very tight (for example, in liquid crystal display substrates or in high definition large screen television displays). During the fabrication of devices employing structured substrates, it is often necessary to precisely modify the surface of the substrate in certain patterns commensurate with the structures on the surface. Such modification can include removing material from selected areas, depositing material on selected areas, or otherwise physically or chemically modifying selected areas.

Conventional lithography techniques may be successfully employed to modify selected areas of surfaces. Such techniques involve first coating a surface with a photoresist material. The photoresist is then selectively exposed to light through a mask so that only those areas of the photoresist not covered by the mask are illuminated. The photoresist in either the illuminated or unilluminated areas is subsequently removed by known techniques (depending on whether a positive or negative photoresist is used), thereby exposing only those portions of the underlying surface to be modified. After modification of the exposed surface (i.e., via etching, deposition, etc.), the remaining photoresist is removed to yield a patterned surface.

Difficulties arise when the surface to be modified is a structured surface. A structured surface is one that comprises a plurality of well-defined protrusions, indentations, or both on an otherwise substantially uniform surface. Often the structures are formed in a repeating pattern as those formed via known microreplication techniques. When modifying only the protrusions, for example, on a structured substrate, conventional lithography techniques require that the mask exactly match the pattern of the protrusions and that the mask is perfectly aligned with the protrusions. This is especially difficult for large area substrates. When using even high precision masks, errors will occur despite a high degree of care during alignment, and these errors will be compounded on larger area substrates. For example, a high precision mask designed to match a 100 $\mu$m repeating pattern to within 0.1 $\mu$m on a 100 cm$^2$ structured substrate would unavoidably result in misalignment of the mask on at least some areas of the substrate. Creating very high precision masks and aligning those masks with equal or better precision can thus be a very difficult, time-consuming, and costly process, and for large enough substrates will simple be impossible. These concerns are multiplied by the fact that a new mask must be designed to match each new substrate or each new set of structures to be modified.

Although lithography techniques are well-known and the art of employing these techniques is both varied and mature, such techniques are incapable of meeting the unique challenges presented when developing patterning processes for structured surfaces at a reasonable cost, especially as surface structures are pushed to smaller and smaller dimensions while substrate areas are pushed to larger and larger dimensions. In particular, conventional lithography techniques involve step-and-repeat process steps and are not adaptable to roll-to-roll continuous processes to pattern structured substrates.

In U.S. Pat. No. 5,382,317 (Thomas), a method of selectively applying a coating to either the upper or lower surface of a bilevel substrate was disclosed. Using this technique, one could modify the protrusions on a structured substrate by first applying a layer of photoresist to the surface and then removing residual photoresist from the tops of the protrusions by using a blade. The protrusions can then be modified while the rest of the surface is protected by photoresist. This technique is limited, however, to surfaces having protrusions that rise to substantially the same level and where the tops of the protrusions are substantially flat. If either one of these conditions does not hold, it is likely that the residual coating present on the protrusion tops will not be completely removed by the blade, and the desired modifications will be incomplete. Even when these conditions do hold, there is no way to ensure that the blade will not leave at least some resist behind. Moreover, large area surfaces pose additional problems because the likelihood for height variations in the protrusions increases with area. Also, this technique is not well suited for surfaces having protrusions that rise only a small distance (i.e. about or less than 2 $\mu$m high) because there is a danger that when removing the coating from the protrusion tops that a portion of the coating between the protrusions may be removed also.

Another method for selectively exposing the tops of protrusions on a structured substrate is disclosed in EP 0 564 364 A2 (McFadden). In this method, a structured substrate is coated with a photoresist and a prism is placed on the substrate so that the prism rests on the protrusion tops, being in contact with only the photoresist that is present on the protrusions. The prism is then irradiated with a collimated light beam as from a laser. At a certain incident angle, the light in the prism will satisfy the conditions for total internal reflection at the surface of the prism adjacent to the substrate. Between protrusions, the prism interface is with air, a lower index medium, and so the light will be totally internally reflected. At the protrusions, the prism interface is with the photoresist which can be chosen to have the same or higher index as the prism so that at least a portion of the light will be transmitted. In this way, the photoresist on top of the protrusions is irradiated while the photoresist between protrusions is left unmodified. The photoresist can then be selectively removed either from the protrusion tops or from the valleys between the protrusions. One difficulty with this method is that the protrusions must be substantially the same height and the photoresist coating on the protrusions must be substantially flat. If there is a deviation in the heights of protrusions, the prism may not contact all the protrusion tops so that not all protrusions will be irradiated. In addition, for substrates larger than a few inches wide, multiple exposures and/or multiple prisms may be required because the entire surface cannot be covered using one prism. Finally, light rays that irradiate the photoresist on the protrusion tops can propagate in the photoresist layer or in the substrate and be trapped by total internal reflection. These trapped light rays may be propagated to areas between protrusions, thus irradiating photoresist in undesired areas.

SUMMARY OF THE INVENTION

The present invention overcomes deficiencies in the art by providing a simple and accurate method for patterning structured substrates over large areas in a continuous manner without regard for the dimensions of the structures. The present invention is a process for modifying protrusions on a structured surface including the initial step of providing a structured surface having a plurality of protrusions thereon. The surface is then coated with a filler material to a thickness at least enough to cover the protrusions to be modified. The filler material is then planed to provide a substantially planar surface so that the filler material can be removed in a substantially uniform fashion to expose the portions of the protrusions to be modified.

Unlike lithography techniques that rely on the precise alignment of mask work with the structures of the substrate, the process for patterning structured substrates of the present invention can be accomplished in a continuous manner without the need to stop and realign or to add different mask work when the substrate is changed. Thus, it is the purpose of this invention to provide a method for maskless patterning of structured substrates. Further, it is the purpose of this invention to provide a method for maskless patterning of structured substrates that is adaptable to continuous processing methods. Still further, it is the purpose of this invention to provide a method for maskless patterning of structured substrates that is independent of the dimensions of the substrate and the dimensions of the structures on the substrate.

As used herein, the term "structured substrate" or "structured surface" refers to a substrate or a surface thereof that comprises a plurality of integral structures such as protrusions, indentations, or combinations thereof other than those due to nonuniformities inherently or unintentionally present on the surface such as defects, scratches, or impurities. Moreover, the term "microstructure" as used herein refers to structures on a structured surface that have characteristic dimensions of from about 0.1 $\mu$m to about 1000 $\mu$m.

DETAILED DESCRIPTION

Figure 1A:
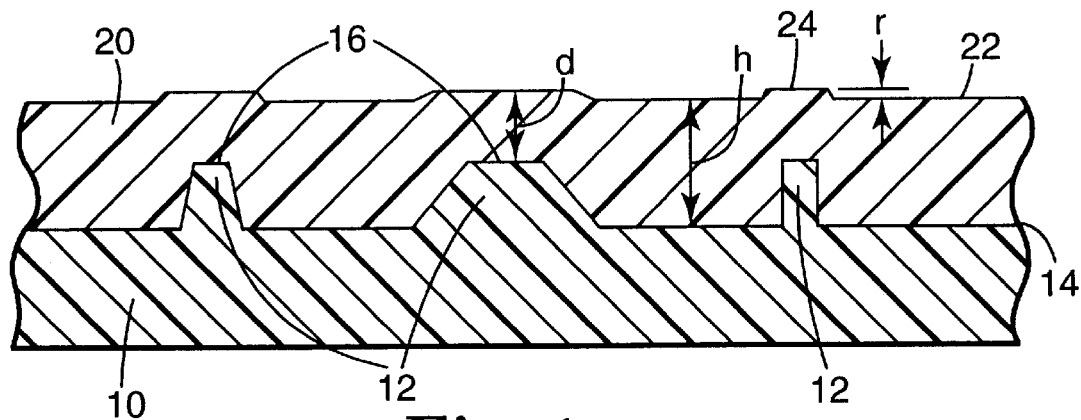
FIG. 1(a) is a schematic cross-sectional representation of a structured substrate comprising a plurality of arbitrarily shape protrusions and coated with a filler material.

The process of the present invention involves first providing a structured substrate 10 as shown in FIG. 1A. The substrate generally comprises a plurality of structural elements. For example, the substrate 10 comprises a variety of arbitrarily-shaped protrusions 12 that rise above the main surface 14 of the substrate. The substrate 10 may be any material that is able to retain the imparted structure. The structure on the substrate may be of any arbitrary type such as posts, ribs, or other structures; they may be of any arbitrary shape; and they may be of any dimensions suitable for the specific application. Preferably, the substrate comprises a microstructured surface such as is generated using known microreplication techniques, resulting in structures having characteristic dimensions on the order of 0.1 $\mu$m to on the order of 1000 $\mu$m. More preferably, the substrate comprises a microstructured surface wherein the structures include a plurality of substantially parallel ridges. Preferably, these ridges have heights of from about 0.1 $\mu$m to about 100 $\mu$m, widths of from about 0.5 $\mu$m to about 1000 $\mu$m, and spacing between them of from about 1 $\mu$m to about 10 mm.

The process of the present invention next involves coating the structured substrate with a filler material 20. The filler material 20 is coated to a thickness, h, sufficient to cover the structures to be modified. The step of coating the structured substrate with filler material to cover the structures of the substrates is referred to as "flood coating." Flood coating may be performed using any known technique for coating, and suitable coating techniques will be obvious to one of ordinary skill once the filler material is chosen. For example, if the filler material is coated in the liquid form, the filler may be applied by gravure roll, doctor blade, knife edge, or other conventional methods.

Either after the step of flood coating or simultaneously with the step of flood coating, the surface of the filler material is planed using methods such as those described hereinafter. The filler material is planed to provide a substantially uniform surface so that uniform removal of the filler yields the same results across the areas of the substrate to be modified. The step of planing the filler material on a structured substrate having a plurality of protrusions may result in a filler layer having a substantially uniform main surface 22 and features representing remnants of the structured protrusions rising to a level 24 above the main surface 22 as shown in FIG. 1A.

The thickness of the planed filler layer can thus be defined as follows: h is the thickness of the filler between the main substrate surface 14 and the main filler surface 22, d is the thickness between the substrate protrusion tops 16 and the filler surface above the protrusions 24, and r is the distance between the filler main surface 22 and the filler surface above the protrusions 24. It is desirable to minimize the ratio r/h in order to obtain a substantially uniform surface. The ratio r/h is preferably less than about 0.1, more preferably less than about 0.05, and most preferably less than about 0.01. It is also desirable to minimize the ratio d/h so that the amount of filler material that must be removed to expose the structures of the substrate is kept to a reasonable amount, thereby reducing the risk of errors such as removing too much filler material when the amount of the structured substrate to be exposed is critical. The ratio d/h is preferably less than about 1.0, more preferably less than about 0.5, even more preferably less than about 0.2, and most preferably less than about 0.1.

The step of planing the filler surface may be accomplished using any technique suitable for forming a uniform surface on the filler coating. For example, excess filler may be removed using a substantially flat blade scraped evenly across the surface with a uniform force. More than one pass with the blade may be required in order to achieve the desired degree of surface uniformity and in order to minimize the ratios r/h and d/h. Another method involves placing a release liner over the filler-coated substrate, moving a thin, flexible stainless steel sheet across the surface of the liner while applying a moderate force to smooth the filler material, curing the filler coating if necessary, and removing the liner. Yet another method involves partially immersing a coating roll in a pan of a filler material and advancing the substrate film over the coating roll with the structured side of the film contacting the coating roll. The thickness of the coating may be controlled by adjusting the tension of the substrate film against the coating roll. Multiple passes may be necessary. A similar method involves spreading a filler material on a structured substrate film and using a nip roll to press the substrate film and filler coating against a smooth embossing roll. The thickness of the filler coating may be controlled by adjusting the pressure between the nip roll and the smooth embossing drum. Other methods of planing the filler surface will be apparent to one of ordinary skill, and the suitability of a particular method of planing will be apparent given the choice of filler material. The steps of coating and planing will result in a structured substrate with a filler coating analogous to that shown in FIG. 1A, preferably with the ratios r/h and d/h minimized.

Figure 1B:
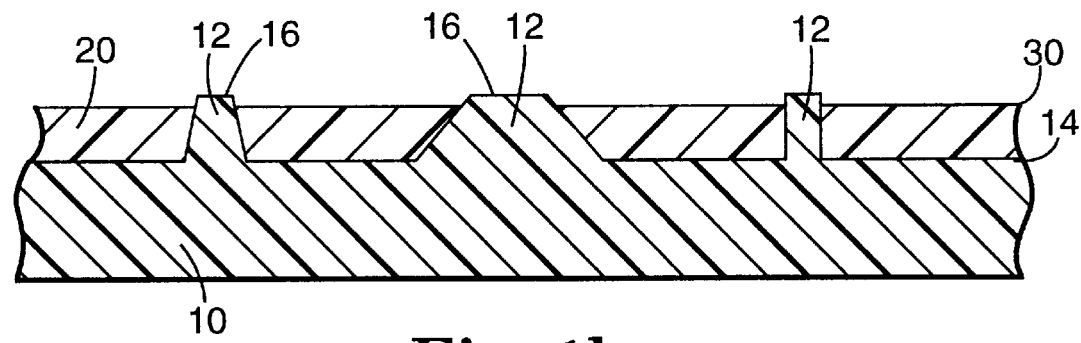
FIG. 1(b) is a schematic cross-sectional representation of the substrate shown in FIG. 1(a) after uniformly removing enough filler material to expose at least the tops of the protrusions.
Figure 2A:
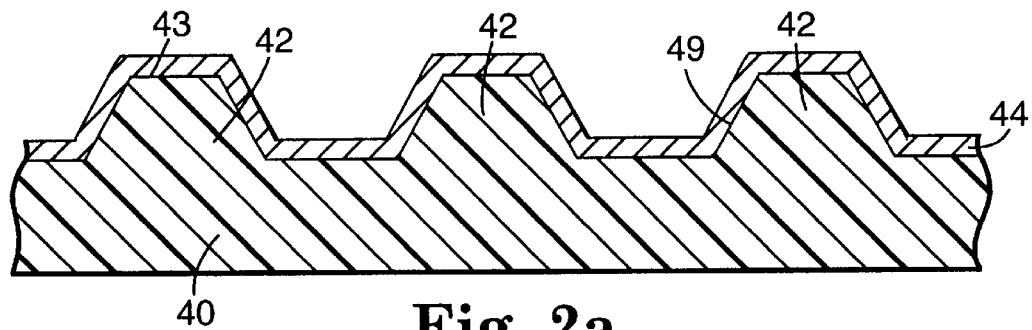
FIGS. 2(a)–(g) is a series of schematic cross-sectional representations of a structured substrate at each of the patterning steps in a particular embodiment of the process of the present invention.
Figure 2B:
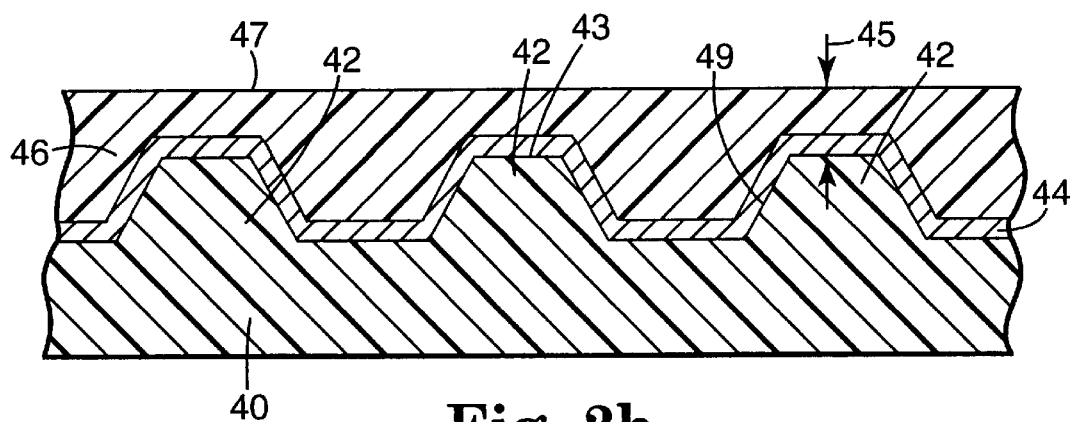
Figure 2C:
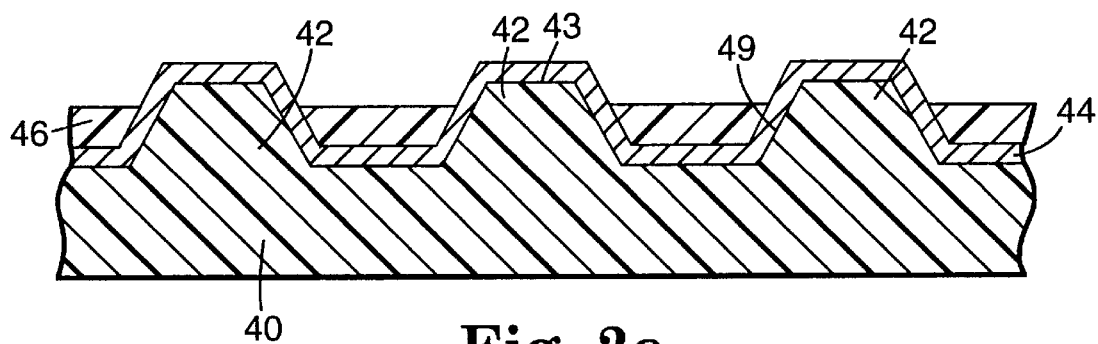
Figure 2D:
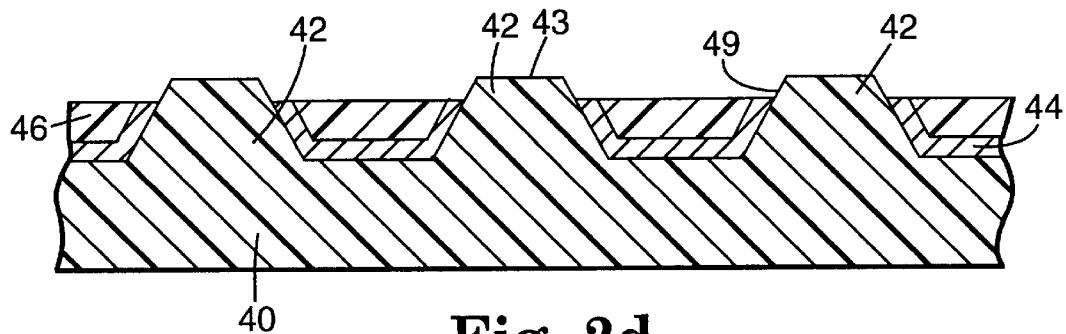
Figure 2E:
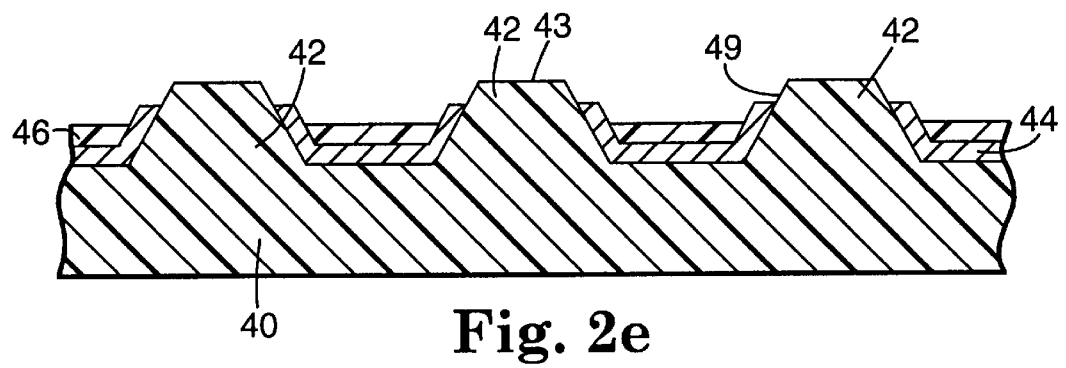
Figure 2F:
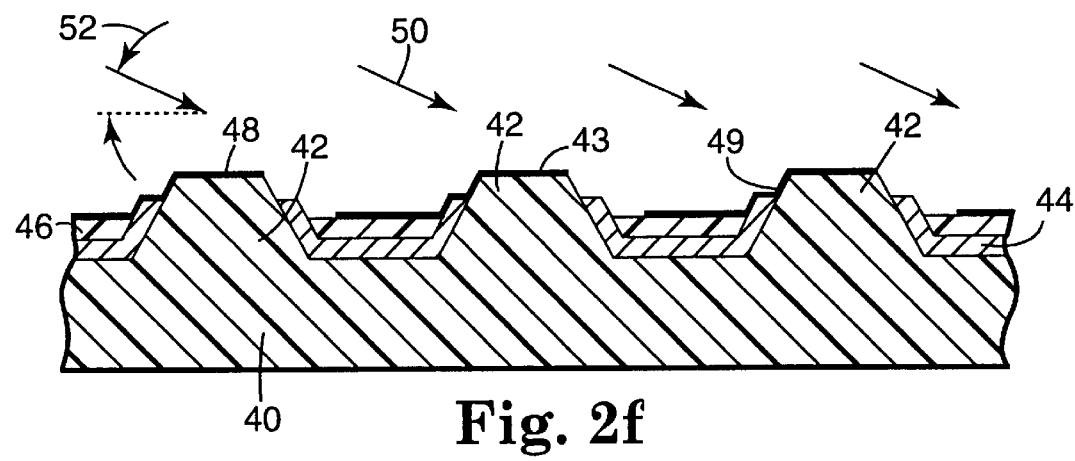
Figure 2G:
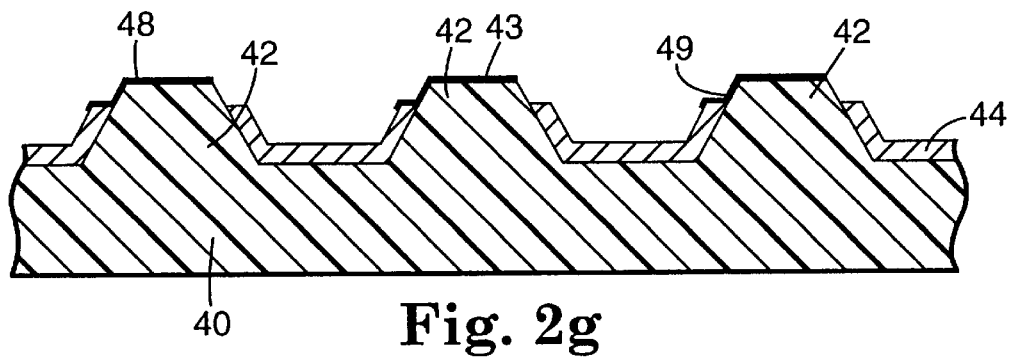

The process of the present invention continues by uniformly removing the filler material until those areas of the substrate structures to be modified are exposed, as shown in FIG. 1B. If the filler material was coated in the liquid form, the filler coating may need to be hardened for the step of uniform removal. Suitable removal methods will depend on the choice of filler material as described hereinafter. In addition, the amount of filler material to be removed will depend on both the amount of substrate structure to be exposed and on the thickness d of the filler coating above the substrate structures. Therefore, in order to minimize both the filler removal time and the possibility of removing too much filler due to extended removal times, the thickness d should preferably be minimized. In particular, d is preferably on the order of or less than the height of the structures above the substrate main surface. More preferably, d is much less than the height of the structures above the substrate main surface.

The filler material may be any material that can be coated onto the structured substrate to substantially cover the structures of the substrate, that can be planed to form a substantially uniform surface, and that can be preferentially and uniformly removed using a technique that does not substantially modify the substrate or the structures thereon. Preferably, the filler material is a material that can be coated onto the structured substrate in the liquid form and then cured to provide a surface that may be planed concurrently or thereafter. Preferably, the filler material is a material that can be removed using an etching process that does not adversely affect the structured substrate. More preferably, the filler material is a photosensitive resist material as may be employed in conventional lithography. Such materials are preferred because they are easily handled and because techniques for their preferential removal are well known.

Examples of specific filler materials and correspondingly suitable removal methods are as follows: (1) a photoresist sold under the trade designation Shipley Resist 1400-37 by Shipley Co., Marlborough, Mass. can be used as a filler and can be etched by exposure to collimated light from a Hg lamp with an intensity of 4.7 mW/cm$^2$ at a wavelength of 365 nm, immersion in a developer sold under the trade designation Shipley Developer 354 also by Shipley followed by rinsing, and baking at 120 degrees C; (2) a resist sold under the trade designation Ronascreen 2400 by LeaRonal, Freeport, N.Y. can be used as a filler and can be etched by immersion in a 0.5% $Na_2CO_3$ solution; (3) a resist comprising the mixture of isobornyl acrylate as sold by Radcure/UCB Chemicals Corporation, Smyrna, Georgia, with 12% by weight of a photoinitiator sold under the trade designation Darocure 1173 also by Radcure can be used as a filler and can be etched by immersion in a 1:1 solution of butyl acetate and ethyl alcohol after curing the filler; (4) a resist comprising a mixture of 10 g of a material sold under the trade designation Photomer 6173 by Henkel Corporation, Ambler, Pa., 4.0 g 2-phenoxyethyl methacrylate (PEM), 1.0 g of iso octyl thio glycolate (IOTG), and 0.4 g of a photoinitiator sold by under the trade designation CGI 1700 by Ciba-Geigy Corporation, Tarrytown, N.Y. can be used as a filler and can be etched by immersion in 0.1% $Na_2CO_3$ solution after curing the filler; (5) and a resist comprising a mixture of 7.7 g Photomer 6173, 6.3 g PEM, 1.26 g of IOTG, and 0.4 g CGI 1700 can be used as a filler and can be etched by immersion in 0.1% $Na_2CO_3$ solution after curing the filler. Other filler materials or mixtures may be chosen depending upon the factors of cost, ease of use, compatibility with the substrate material, compatibility of suitable removal techniques with the substrate material, and the ability of the filler material to act as a resist to protect the areas of the substrate not to be modified from the applicable modification techniques.

It should be noted that in the process of the present invention, the step of planing the filler coating and the step of removing the filler coating until the areas to be modified are exposed may be modified by choosing filler materials having uniquely desirable properties or by mixing additives into filler materials to create desirable properties.

For example, the step of planing the surface of the filler coating can occur simultaneously with the step of coating the substrate with the filler material. Specifically, by choosing an appropriate filler material having the right liquid surface tension and viscosity, or by adding a surfactant or a viscosity modifier to the filler material to obtain the right surface tension and viscosity, the step of flood coating itself may result in a planed surface. Viscosity modifiers may be in the form of solvents or reactive diluents that decrease the viscosity of the filler material when added, or thickening agents such as fumed silica that increase the viscosity of the filler material when added.

As a comparative example, two filler material formulations were mixed using the same materials in different ratios. The mixtures comprised amounts of the following materials: (a) a material sold under the trade designation SR340 by Sartomer Company, Exton, Pa., (b) a material sold under the trade designation Photomer 6173 by Henkel Corp., Ambler, Pa., (c) a photoinitiator sold under the trade designation CGI1700 by Ciba-Geigy Corporation, Tarrytown, N.Y., (d) iso octyl thio glycolate (IOTG), and (e) a surfactant sold under the trade designation FC430 by 3M Company, St. Paul, Minn. Sample A was made by mixing 49.5 g of (a), 60.5 g of (b), 5.5 g of (c), 5.4 g of (d) and 0.33 g of (e), resulting in a filler material having a surface tension of 29.0 dynes/cm. Sample B was made by mixing 49.5 g of (a), 60.5 g of (b), 5.5 g of (c), 5.4 g of (d) and 0.083 g of (e), resulting in a filler material having a surface tension of 32.5 dynes/cm. Each filler material was coated on a substrate having a series of ridges that were approximately 4 $\mu$m high, 30 $\mu$m wide, and spaced 300 $\mu$m apart. Sample A yielded a coating having a thickness r (defined in FIG. 1A) of 0.6 $\mu$m. Sample B yielded a coating having a planar surface with no measureable r thickness. Thus, the planing step may occur merely by applying the filler coating if the formulation of the resist material is correct.

The filler material may also be formulated to have a surface tension that closely matches the surface energy of the surface of the substrate to be coated. This may yield desirable results when the filler material is coated to a thickness h that approximates the height of the protrusions on the substrate. When the thickness of the filler coating closely matches, or is slightly less than, the height of the protrusions, and the surface tension of the filler material closely matches the free surface energy of the substrate, the tendency of the liquid filler material to dewet from the tops of the protrusions is maximized, thus leaving the tops of the protrusions substantially free of liquid filler material. If such conditions are reached, then the filler material need only be hardened to expose the tops of the protrusions to be modified. This special situation eliminates both the planing step and the step of removing filler material to expose the tops of the protrusions.

Once the portions of the substrate structures to be modified are exposed by removal of the desired amount of filler material, the exposed portions can be modified. In FIG. 1B, the protrusion tops 16 have been fully exposed by uniform removal of a certain amount of the filler material 20. In addition, those portions of the substrate that are not to be modified remain protected by the filler material. The exposed areas can be modified by methods that include etching (or otherwise removing pre-existing external layers from the substrate protrusions) and depositing (or otherwise coating extra layers onto the exposed areas of the substrate). In addition, after a first modification of the substrate structures, it may be desirable to remove an additional amount of filler material and further modify the substrate structures over a now larger area. In such a way, the steps of uniformly removing the filler and modifying the exposed areas of the substrate may be repeated to produce the desired substrate patterning.

When the modification of the substrate is complete, the remaining filler may be removed from the substrate by etching methods or simply by a lift-off method.

EXAMPLE

A specific embodiment of the process of the present invention is described below. The following embodiment and the other examples discussed herein are meant to illustrate the process for the maskless modification of structured substrates of the present invention and are not meant to limit the scope of the present invention.

As discussed below, the process of the present invention may be employed to pattern structured plastic substrates for liquid crystal displays with opaque, conductive coatings on the rib tops to serve both as a dark matrix and as conductive bus lines.

As disclosed in U.S. Pat. No. 5,268,782, the disclosure of which is incorporated by reference herein, liquid crystal display substrates having microstructured parallel ribs imparted thereto can be formed. The function of the ribs is to provide precision spacing elements that create a uniform gap between the main surface of the first, structured substrate and a second substrate in order to achieve a uniform display appearance even across large displays.

Typical liquid crystal displays comprise two parallel substrates that confine a liquid crystal mixture in the uniform gap therebetween. In twisted nematic liquid crystal devices, for example, cholesteric liquid crystals are employed, the molecules of which have a helical or twisted molecular orientation. The molecules are oriented in the gap between the substrates so that each molecule goes through a 90 degree twist. The inside surface of each substrate includes parallel strips of a TCO, usually indium tin oxide, that act as independently addressable electrodes. The TCO strips of the first substrate are oriented perpendicular to the TCO strips of the second substrate so that the area through the display in which electrodes of the two substrates cross create picture elements (pixels). When an electric field is applied to the liquid crystal material between two crossed electrodes, the molecules in that pixel region re-orient and "unwind" due to the electrical anisotropy of the molecules. This behavior allows the molecules to rotate polarized light when in the twisted state and pass light without rotation when in the untwisted state. When used in combination with crossed polarizers associated with each substrate element, twisted molecules will pass light whereas the activated pixel element will appear dark. In this manner, each pixel area which can be turned on or off by addressing crossed electrodes simultaneously.

When microstructured substrates comprising a series of substantially parallel ribs are employed in liquid crystal display devices, the ribs act as spacers between the two substrates and can also be used to physically separate the TCO strips for electrical isolation. The process of the present invention can be employed to pattern these TCO strips on the microstructured substrate. In addition, because TCO materials have a relatively low conductivity, there may be noticeable delays in the response time of the display, especially when fast refresh rates are required and when large, high resolution displays are used. In this case, the process of the present invention can also be employed to pattern auxiliary conductive strips that will increase the conductivity of the TCO electrodes to thereby decrease the response time of the display.

In a particular embodiment, a microstructured substrate 40 as depicted in FIG. 2($a$) comprising parallel ribs 42 having dimensions 4.5 $\mu$m high, 30 $\mu$m wide, and spaced 300 $\mu$m apart (center to center), was coated with a 700 Angstrom thick film 44 of indium tin oxide (ITO), a common TCO material used in liquid crystal displays. The steps of patterning this substrate using one embodiment of the process of the present invention are depicted in FIGS. 2($a$)–($g$).

After providing the microstructured substrate 40, the substrate was flood coated with a filler material 46 comprising Shipley Resist 1400-37 (as identified above), and the resist coating was planarized by scraping with a blade to form a uniform surface 47. The resulting resist coating thickness 45 above the rib tops 43 after the planing step was about 0.4 $\mu$m (shown in FIG. 2($b$)). The sample was then immersed in 0.1% $Na_2CO_3$ solution for 40 seconds to remove enough resist to expose the ITO coated rib tops 43 (shown in FIG. 2($c$)). The ITO layer 44 was etched from the rib tops 43 by immersing the sample in a 10% solution of HCl for 70 seconds at room temperature. This step created electrically isolated strips of ITO whereby the ITO remained in the valleys between ribs 42 and on the rib slopes 49 but not on the rib tops 43 (shown in FIG. 2($d$)). If the remaining photoresist were removed at this point, the resulting substrate would comprise suitably patterned ITO electrode strips for use in a liquid crystal display.

Rather than removing the remaining photoresist, the sample was next immersed in 0.1% $Na_2CO_3$ solution for another 40 seconds to remove more of the resist coating 46 and to thereby expose a portion of the ITO coated rib slopes 49, but without exposing the main surface of the substrate 40 (shown in FIG. 2($e$)). The sample was then coated with a 2000 Angstrom thick layer 48 of Cr metal by vacuum deposition. The Cr was deposited using a substantially collimated beam 50 incident upon the sample at an angle 52 which measured 15 degrees from a line in the plane of the substrate 40 perpendicular to the ribs 42 (shown in FIG. 2($f$)). This step is referred to as "shadow coating" because each protrusion blocks the collimated beam from depositing material in an areas behind the protrusion, thus casting a "shadow." In this manner, only the rib tops and the sides of the rib slopes facing the collimated deposition beam were coated with Cr, leaving a portion of the "back" side of the rib slopes free of both Cr and ITO (shown in FIG. 2($f$)). Thus, electrical isolation of the ITO strips was maintained. After shadow coating the metal layer, the remaining filler material was removed by lift-off (shown in FIG. 2($g$)).

The presence of the Cr layers performs two functions. First, the Cr layer increases the conductivity of the ITO layer which it contacts. In this example, the conductivity of the ITO strips was increased by a factor of about 100. The amount by which the conductivity is increased can be adjusted higher or lower by depositing thicker or thinner metal layers. The transparency of the display substrate was not adversely affected because the opaque Cr layer was confined to the inactive regions of the device, namely the rib tops and a portion of the rib slopes. Only the flat areas of the substrate between the ribs are active areas.

Further, the opaque quality of the Cr layer performs a contrast-enhancing function in displays that do not employ a crossed polarizer construction. In such a device, light in the inactive regions (i.e. the rib tops where there is no liquid crystal) would be transmitted. When pixels are activated, they appear dark. If the inactive regions adjacent to activated pixels transmit light, the pixels appear gray rather than black, thus reducing, or "washing out," the contrast of the display. However, when coated with the opaque metal layer, the rib tops do not allow light to be transmitted in the inactive regions. In this way, activated pixel areas appear black at the cost of adding thin dark lines that do not adversely affect the appearance of the lighted portions of the display.

What is claimed is:

1. A method for selectively modifying ridges on a substrate comprising the steps of:
   providing a structured substrate having
      a main surface,
      a plurality of substantially parallel ridges extending from the main surface, each ridge having a top, a first side, and a second side, and
      a conductive layer substantially covering the main surface and the ridges;
   flood coating the substrate with a filler material and planing the filler material on the substrate, wherein the step of coating and planing results in a filler coating having a substantially planar outer surface extending a distance, h, from the main surface of the substrate and extending a distance, d, from the ridges, the ratio d/h being less than about 0.5;
   uniformly removing material from the planar outer surface of the filler coating to expose a top portion of the ridges;
   removing portions of the conductive outer layer from the exposed top portions of the ridges;
   removing an additional amount of filler material in a substantially uniform fashion to thereby expose a portion of the ridge sides; and
   depositing a material on the ridges.

2. The method of claim 1, wherein the filler material comprises a photosensitive resist material.

3. The method of claim 1, wherein the conductive outer layer comprises a transparent conductive oxide.

4. The method of claim 2, wherein the transparent conductive oxide comprises indium tin oxide.

5. The method of claim 4, wherein the step of removing the indium tin oxide comprising layer comprises etching the layer in a solution of about 5% to about 20% HCl by volume.

6. The method of claim 1, wherein the step of depositing a material on the ridges is performed by shadow coating whereby a collimated beam of the material to be deposited is incident upon the substrate at an angle sufficient to deposit material on the tops of the ridges and on only one side of each ridge.

7. The method of claim 6, wherein the deposited material forms an optically opaque layer on the ridge tops.

8. The method of claim 6, wherein the deposited material is a metal.

9. The method of claim 1, wherein the substrate is a component of a liquid crystal display panel.

10. A method for patterning electrodes on a microstructured liquid crystal display substrate, comprising the steps of:
    providing a substrate having a plurality of parallel microstructured ribs protruding from a main surface;
    depositing a layer of conductive material over the ribs and the main surface;
    flood coating the substrate with a filler material and planing the filler material on the substrate, wherein the step of coating and planing results in a filler coating having a substantially planar outer surface extending a distance, h, from the main surface of the substrate and extending a distance, d, from the ribs, the ratio d/h being greater than 0 and less than about 0.5;
    uniformly removing the filler material to expose desired portions of the ribs;
    removing the conductive material from the exposed portions of the ribs to leave parallel strips of conductive material on the substrate separated by the microstructured ribs; and
    removing the remaining filler material from the substrate.

11. The method of claim 10, wherein the substrate is substantially transparent to visible light.

12. The method of claim 10, wherein the microstructured ribs have heights in a range of about 0.1 $\mu$m to 100 $\mu$m, widths in a range of about 0.5 $\mu$m to 1000 $\mu$m, and spacings between adjacent ribs of about 1 $\mu$m to 10 mm.

13. The method of claim 10, wherein the layer of conductive material is substantially transparent to visible light.

14. The method of claim 10, wherein the conductive material comprises indium tin oxide.

* * * * *